United States Patent
Kurd et al.

(10) Patent No.: US 6,704,892 B1
(45) Date of Patent: Mar. 9, 2004

(54) AUTOMATED CLOCK ALIGNMENT FOR TESTING PROCESSORS IN A BYPASS MODE

(75) Inventors: Nasser A. Kurd, Hillsboro, OR (US); Javed S. Barkatullah, Portland, OR (US); Tim Frodsham, Portland, OR (US); David J. O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 469 days.

(21) Appl. No.: 09/583,268

(22) Filed: May 31, 2000

(51) Int. Cl.$^7$ ............................................. G01R 31/28
(52) U.S. Cl. ...................... 714/724; 327/163; 709/400
(58) Field of Search ................ 714/724, 726, 714/740; 377/48; 371/22.1; 331/2, 17, 25; 307/271; 368/113, 118; 327/163; 709/400; 713/501; 710/305; 868/118

(56) References Cited

U.S. PATENT DOCUMENTS

| | | | | |
|---|---|---|---|---|
| 5,103,114 A | * | 4/1992 | Fitch | 307/271 |
| 5,235,566 A | * | 8/1993 | Merrill | 368/113 |
| 5,565,816 A | * | 10/1996 | Coteus | 331/2 |
| 5,661,731 A | * | 8/1997 | Yip et al. | 371/22.1 |
| 5,802,132 A | * | 9/1998 | Pathikonda et al. | 377/48 |
| 5,983,377 A | * | 11/1999 | Knotts | 714/726 |
| 6,043,717 A | * | 3/2000 | Kurd | 331/17 |
| 6,052,810 A | * | 4/2000 | Creek | 714/740 |
| 6,201,448 B1 | * | 3/2001 | Tam et al. | 331/25 |
| 6,297,702 B1 | * | 10/2001 | Locker et al. | 331/2 |

* cited by examiner

*Primary Examiner*—Albert Decady
*Assistant Examiner*—Dipakkumar Gandhi
(74) *Attorney, Agent, or Firm*—Trop, Pruner & Hu, P.C.

(57) ABSTRACT

In a bypass mode, a tester may bypass the core and input/output phase locked loops (PLLs) utilized by a processor to develop internal clock signals. External, tester-generated, phase shifted clock signals may be used to generate aligned high frequency signals to replace those generated by the phase locked loops. A plurality of phase shifted, tester generated clock signals may be subjected to an exclusive OR operation for generating input/output and core clock replacement signals. The clock signals received from the tester may also be aligned. Thus, a variety of skews may be compensated before entering the bypass mode. In some embodiments of the present invention, the core and I/O PLL clocks are used to establish alignment in a set-up phase and in other embodiments, the core and I/O PLL need not be utilized at all to generate appropriate internal clock signals from an external tester.

4 Claims, 14 Drawing Sheets

 FIG. 3a  byclk0
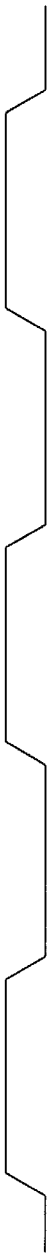 FIG. 3b  byclk1
 FIG. 3c  byclk2
 FIG. 3d  byclk3
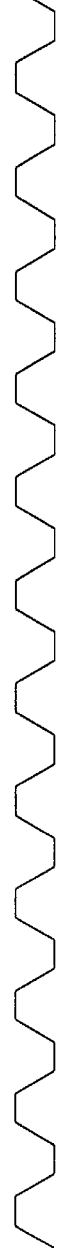 FIG. 3e  bypclk

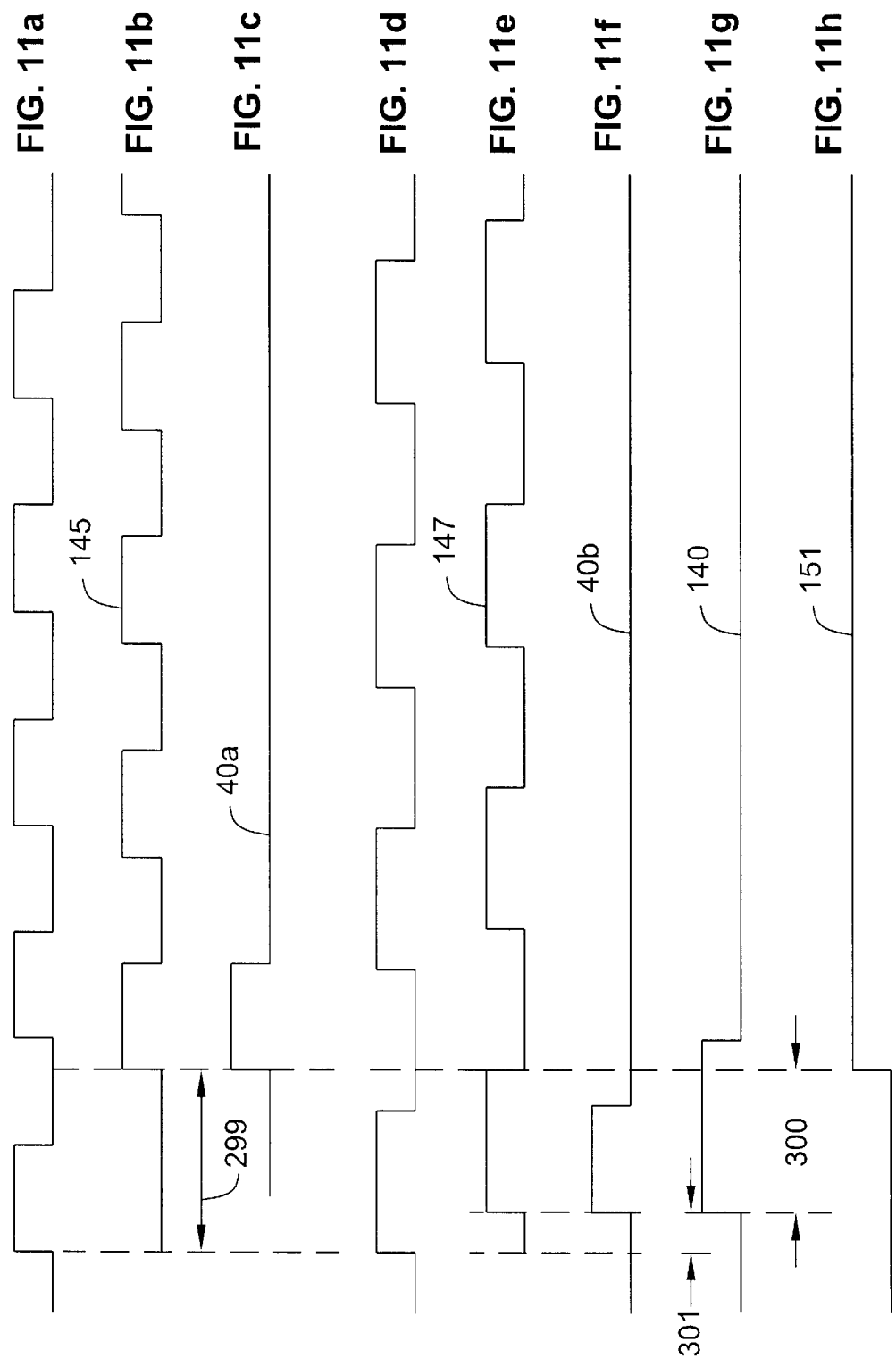

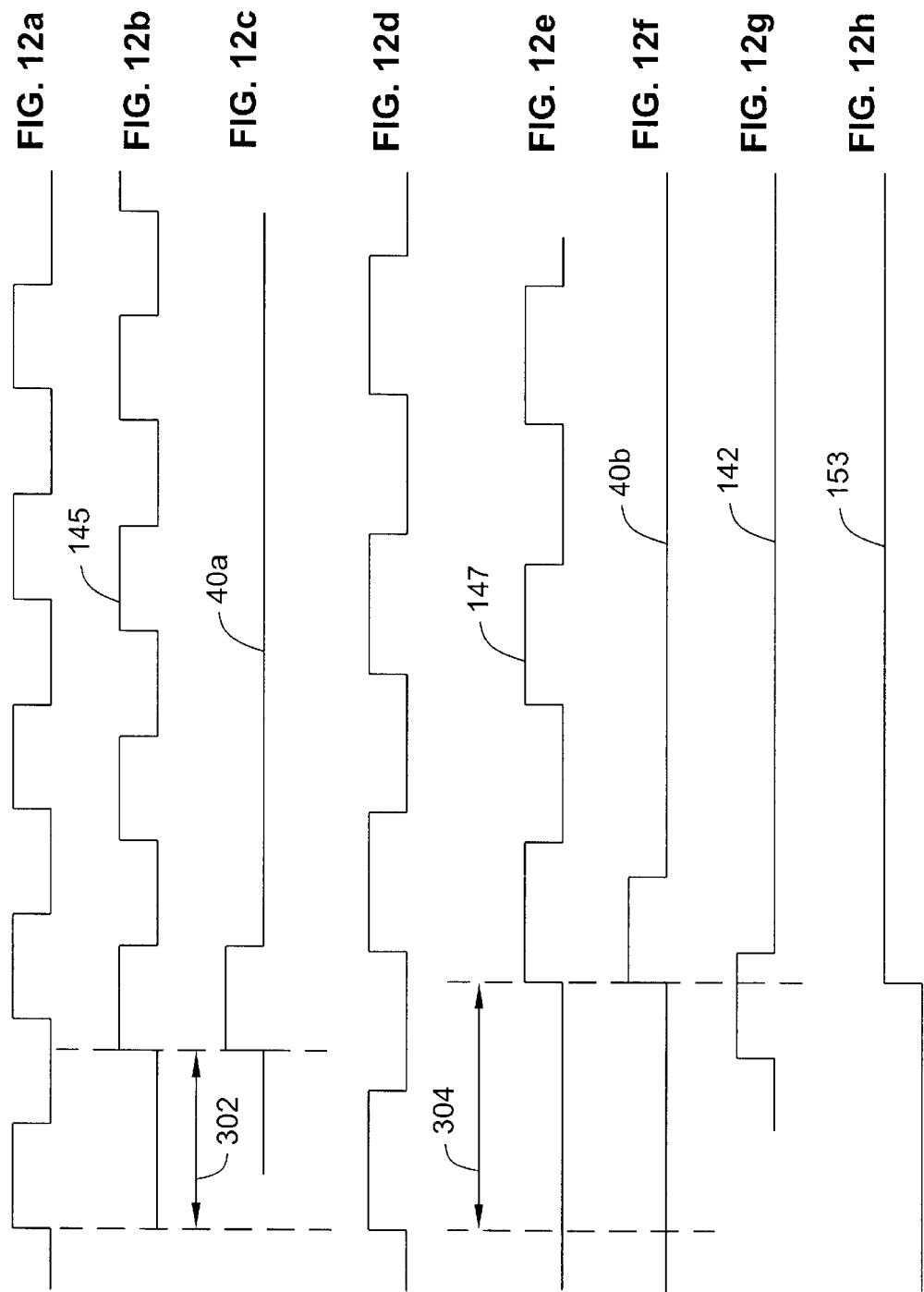

AUTOMATED CLOCK ALIGNMENT FOR TESTING PROCESSORS IN A BYPASS MODE

BACKGROUND

This invention relates to testing processors.

Integrated circuit devices such as processors may be subjected to industry standard test protocols such as the IEEE Standard Test Access Port and Boundary-Scan Architecture, IEEE Standard 1149.1 (1990) (hereinafter referred to as IEEE 1149). In IEEE 1149, a device which may be called a tester is coupled through a test access port (TAP) to an integrated circuit device under test. The device under test may include a plurality of cells that allow different components of the integrated circuit to be tested. Each of these cells may receive input information and may provide output information through a so-called scan procedure. Thus, the integrated circuit may be subjected to a number of test signals and the response of the integrated circuit may be scanned out and analyzed. In some cases, the integrated circuit may be caused to execute one cycle at a time so that the results of each cycle may be analyzed.

In normal operation, one or more phase locked loops (PLLs) may be utilized in a processor. The role of a PLL in a processor is to synthesize an internal chip clock as well as to account for any clock distribution skews. By accounting for clock distribution skews, the processor may operate synchronously.

In some high-speed processors, there is an input/output (I/O) PLL and a core PLL each producing a separate clock signal. Both PLLs share a common reference clock that is supplied externally. Each PLL also receives a signal from a feedback loop that includes its own clock distribution tree. Each clock distribution tree includes a plurality of state elements that receive and utilize the signal produced by a PLL. The feedback loop signals are utilized to enable each PLL to account for clock distribution tree skews.

In systems with two PLLs, the two resulting clock signals are aligned because of the use of a common reference clock together with feedback signals seen at the end of each clock distribution tree. Each PLL must generate a clock signal and account for skews so that all of the state elements in the clock distribution tree see the same clock signal at the same time both within the processor as well as in interfaces to external integrated circuits.

In one test mode, the PLL or PLLs of a processor may be bypassed. One may wish to bypass the PLLs to be able to debug the processor without the PLLs in the picture. One example of a situation where one may wish to do this is when it is desired to operate the processor in regions outside the PLL's specified range. One may want to test the processor outside the PLL's range in order to ensure that the processor works beyond the specified operating range. Other test modes, in addition to a PLL mode and a bypass mode may be utilized as well.

One may also want to bypass the PLLs to isolate PLL introduced errors from those errors introduced by the clock distribution tree. For example, a PLL mode and a bypass mode may be run side-by-side to examine errors, jitter or other clock inaccuracies that occur in one mode versus those that occur in another mode.

In some cases, the bypass mode may be more effective for debugging than in a mode in which the PLLs are utilized. For example, it may be desirable to run varying pulse lengths within a given cycle. It may be easier to do such analyses without using a PLL, especially in cases when multiple clock edges may be of importance.

In addition, because the PLLs are basically analog circuits that operate in digital integrated circuit, there may be cases when it is desirable to operate without the PLLs. The most apparent of these is the situation where the design of the PLL is not complete and yet it is still desired to test the logic circuits.

In modern processors which operate at very high frequencies and which use multiple PLLs, a number of problems arise in attempting to utilize a bypass mode. For example, without the PLLs there is no way to synthesize the clock signals in a space efficient way. Merely adding additional on-chip PLLs may take too much space. Moreover, in a bypass or test mode, using an auxiliary PLL may simply perpetuate the same types of errors that arose from the original PLL.

Another problem arises from the fact that the PLLs also compensate for clock distribution tree skews. If the PLLs are bypassed, it is desirable to avoid clock distribution skews.

Finally, in high speed processors, the resolution of the automated test equipment may become an issue. In order to achieve sufficiently high frequency signals from different signal edges and with different signal channels from the tester, the tester channel accuracy may become an issue. Tester channel accuracy arises from equipment accuracy, processor package routing skew and on-die signal skew. Thus, it is desirable for the edges and channels to all be aligned to avoid generating distorted clock signals that have different shapes, duty cycles or periods. Without the PLL, there is no way to account for these tester channel inaccuracy problems.

Thus, there is a need for a way to operate high speed processors in a PLL bypass mode.

BRIEF DESCRIPTION OF THE DRAWINGS

FIGS. 3a through 3d show hypothetical waveforms of tester generated clock signals in accordance with one embodiment of the present invention;

FIG. 3e shows a hypothetical core clock signal waveform derived from the tester generated waveforms shown in FIGS. 3a–3d;

FIGS. 11a through 11h show a plurality of hypothetical clock signals in an embodiment in which the I/O clock leads;

FIGS. 12a through 12h show a plurality of hypothetical clock signals in an embodiment in which the I/O clock lags;

DETAILED DESCRIPTION

Figure 1:
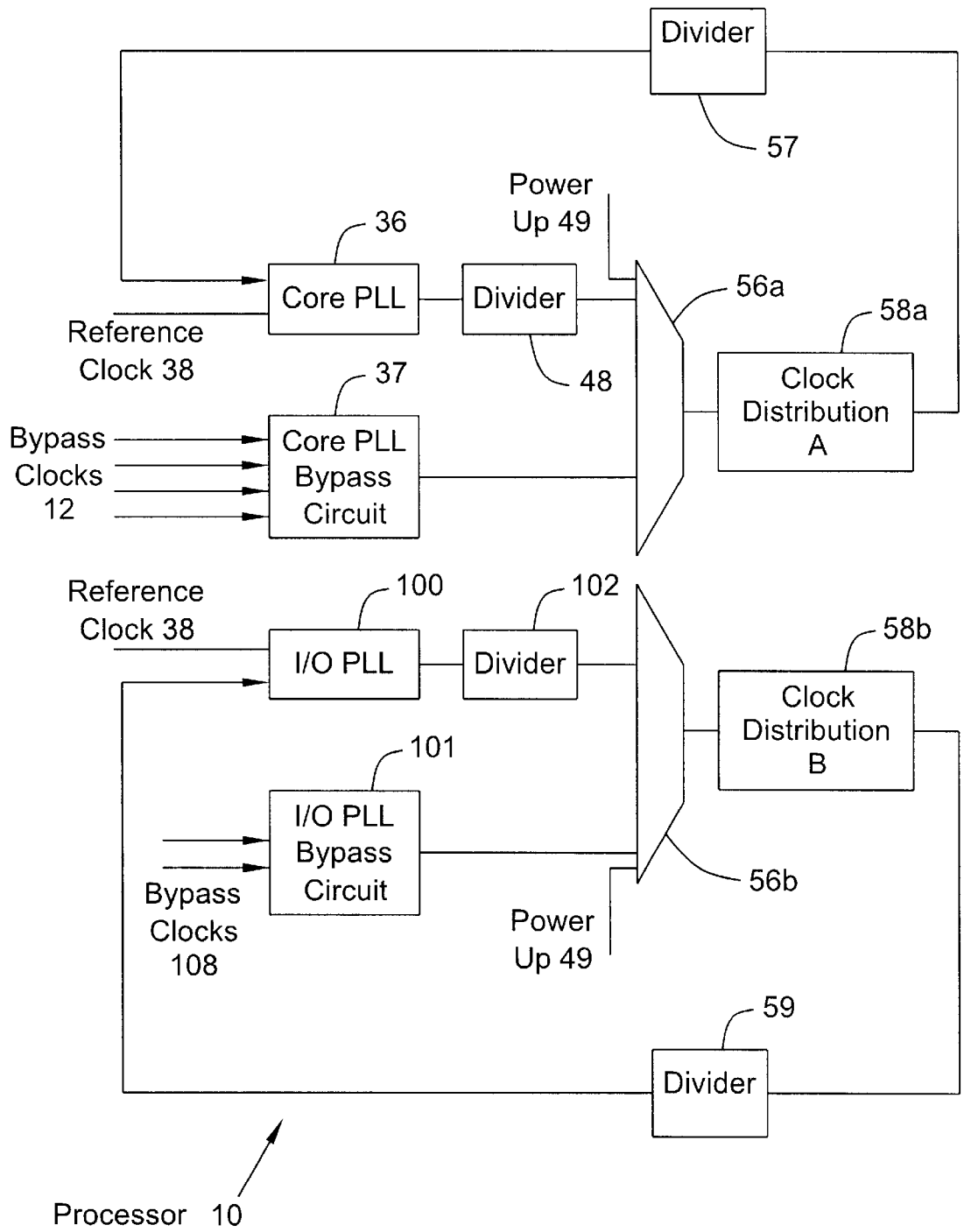
FIG. 1 is a schematic depiction of a tester and a processor according to one embodiment of the present invention.

A processor 10, shown in FIG. 1, may include a core phase locked loop (core PLL) 36 and an input/output phase locked loop (I/O PLL) 100. The core PLL 36 is coupled to a divider 48 whose output is coupled to a multiplexer 56a. Similarly, the I/O PLL 100 is coupled through a divider 102 to the multiplexer 56b.

Figure 2:
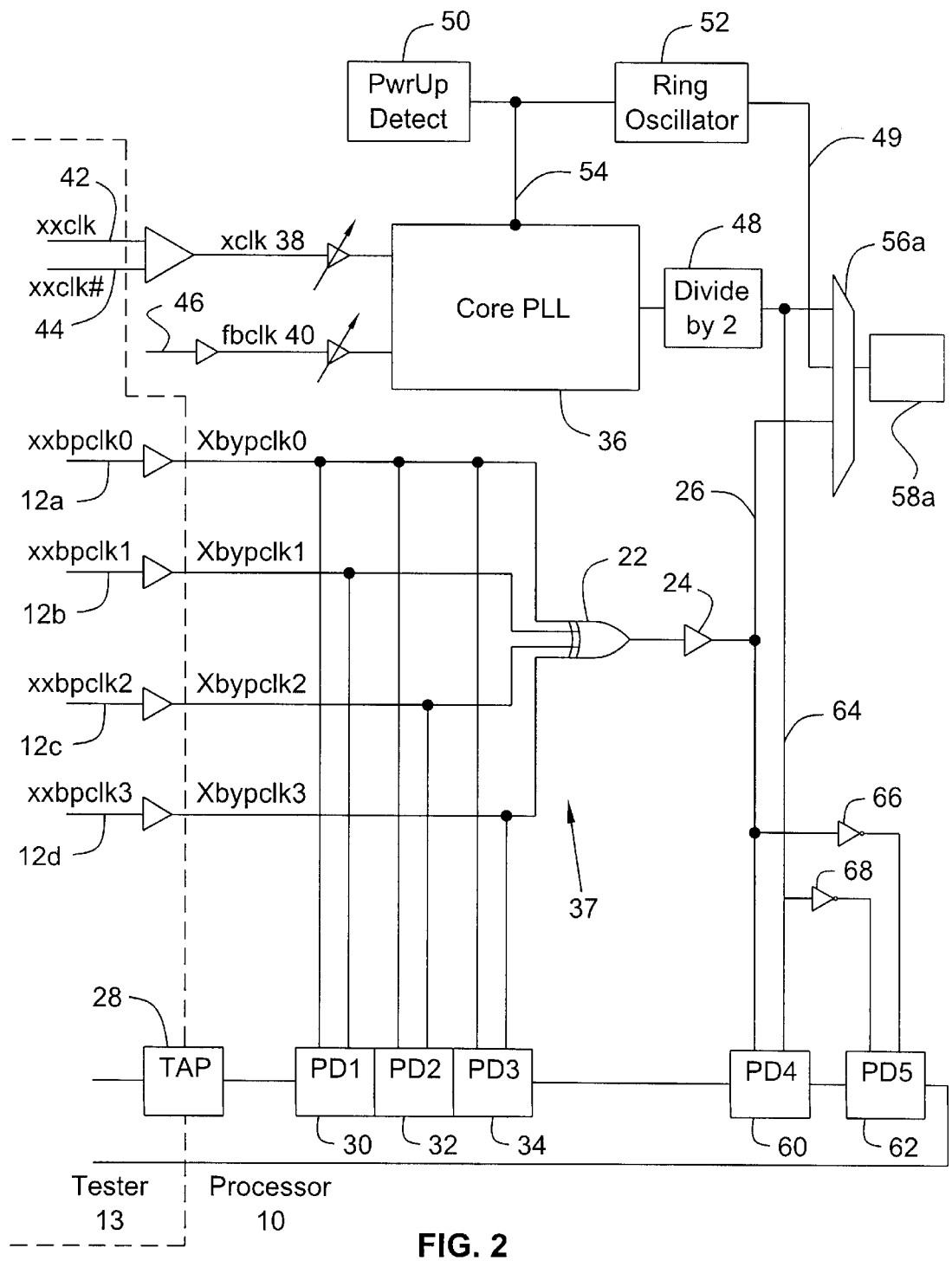
FIG. 2 is a schematic depiction of a tester and a portion of a processor including the core PLL, in accordance with one embodiment of the present invention.

The multiplexer 56a also receives inputs from a core PLL bypass circuit 37 that may be utilized in a bypass mode to generate the signal normally generated by the core PLL 36 from bypass clocks 12 provided by the tester 13 (FIG. 2). Similarly, an I/O PLL bypass circuit 101 may generate a replacement signal for the I/O PLL 100 using bypass clocks 108 generated by the tester 13 (FIG. 2).

Finally, a power up signal 49 may be generated by circuitry not shown in FIG. 1. The power up signal 49 acts as a clock signal for the processor during a power up mode before the core PLL 36 and the I/O PLL 100 are operational.

Selected outputs from the multiplexers 56 may be provided to the clock distribution trees 58a and 58b. Each clock distribution tree is coupled to a divider 57 or 59 that provides feedback clock signals to the core PLL 36 and the I/O PLL 100 respectively. The core PLL 36 and the I/O PLL 100 both receive the same reference clock 38 that is provided to all the other components on the processor 10. Thus, the core PLL 36 and the I/O PLL 100 may be synchronized and may accomplish clock skew compensation for skews arising from their different clock distribution trees 58a and 58b. The same result may be achieved by the core PLL bypass circuit 37 and the I/O PLL bypass circuit 101 in a PLL bypass mode.

Referring to FIG. 2, a processor 10 under test may be coupled to receive clock signals from a tester 13, in accordance with one embodiment of the present invention. A plurality of tester-generated clock signals 12 may be provided to the processor 10. Each of the clock signals 12 may be passed to an exclusive OR gate 22. The resulting signal passes through the amplifier 24 and a line 26 to a multiplexer 56a.

The multiplexer 56a connects to a clock distribution tree 58a. The signal that results from the clock distribution tree 58a is then passed back to the core PLL 36 as the divided feedback clock signal 40 (divider not shown in FIG. 2). The core PLL 36 receives a reference clock signal 38 which is a combination of a reference clock signal 42 and a reference clock inverse signal 44. The reference clock signal 42 is the reference clock that is utilized to generate all the clock signals utilized by the processor 10. The core PLL 36 develops an output signal which is divided by a divide by two circuit 48 and which is passed to one input port of the multiplexer 56a. Thus, in conventional operation (not a bypass mode) the output signal from the divide by two circuit 48, provided to the multiplexer 56a, is then provided by the multiplexer 56a to the clock distribution tree 58a.

During a start up mode while power is ramping up, a power up detector 50 may be utilized to initiate a ring oscillator 52 which generates a clock signal 49 to each multiplexer 56. This signal 49 may be provided to each clock distribution tree 58 during a start up mode.

In order to bypass the core PLL 36, the clock signals 12 may be generated by the tester 13 and provided to the processor 10. Thus, it is desirable to utilize these signals 12 to generate a higher frequency signal on the line 26 which may be provided to a multiplexer 56 in place of the signal generated in conventional operation by the core PLL 36.

Each of the tester-generated clock signals 12 is consecutively phase shifted forty-five degrees as indicated in FIGS. 3a through 3d in one embodiment. As a result of the exclusive OR operation, a fifty percent duty cycle, high frequency core clock signal, shown in FIG. 3e, is created on line 26.

Thus, the lower frequency tester-generated clock signals 12 are used to generate a higher frequency bypass clock signal on the processor 10. This higher frequency clock signal may be utilized in place of the clock signal produced, in normal processor 10 operation, by the core PLL 36 in accordance with one embodiment of the present invention.

The phase detectors 30, 32, 34, 60 and 62 may be utilized to align the tester-generated clock signals 12 as well as to align the clock signal generated to replace the signals normally generated by the core and I/O PLLs 36 and 100. The phase detectors 30, 32, and 34 detect systematic skew between the tester 13 and the tester-generated signals 12.

The phase detectors 30, 32 and 34 compare the phases of each of the signals 12. The results of the comparison, stored in the phase detectors 30, 32, and 34, may be scanned out through the TAP 28 to the tester 13. As a result, the serially scanned out information may be utilized in the tester 13 to find that amount of phase offset needed by each of the signals 12 to remove the detected skew.

The phase detector chain is controlled by the TAP 28 and contains information about the alignment of the clock signals 12. The tester 13 then adjusts its clock signals 12 accordingly and performs the scan in/scan out process until the desired alignment is achieved.

Fine-tuning to compensate for clock distribution skew may be achieved through the phase detectors 60 and 62. In some embodiments of the present invention, the alignment scheme may depend on achieving core PLL 36 lock. The phase detectors 60 and 62 compensate for clock distribution skews arising from the accuracy of the core PLL 36 in its normal mode. In addition, the phase detectors 60 and 62 provide a duty cycle adjustment for the clock signals 12. Also, the phase detectors 60 and 62 allow the user to provide path non-symmetry correction through the exclusive OR gate 22. Finally, the phase detectors 60 and 62 correct for inaccuracies in the forty-five degree offset in the tester-generated signals 12 shown in FIGS. 3a through 3d.

In the bypass mode, the core PLL 36 and I/O PLL 100 are bypassed and replacement, tester-controlled signals are driven externally from the tester 13. Tester channel alignment to align these external clocks may be performed before the bypass test operation begins. The core bypass clock signal is generated by an exclusive OR of the four tester-generated clock signals 12 that are phase shifted forty-five degrees with respect to one another.

Figure 4:
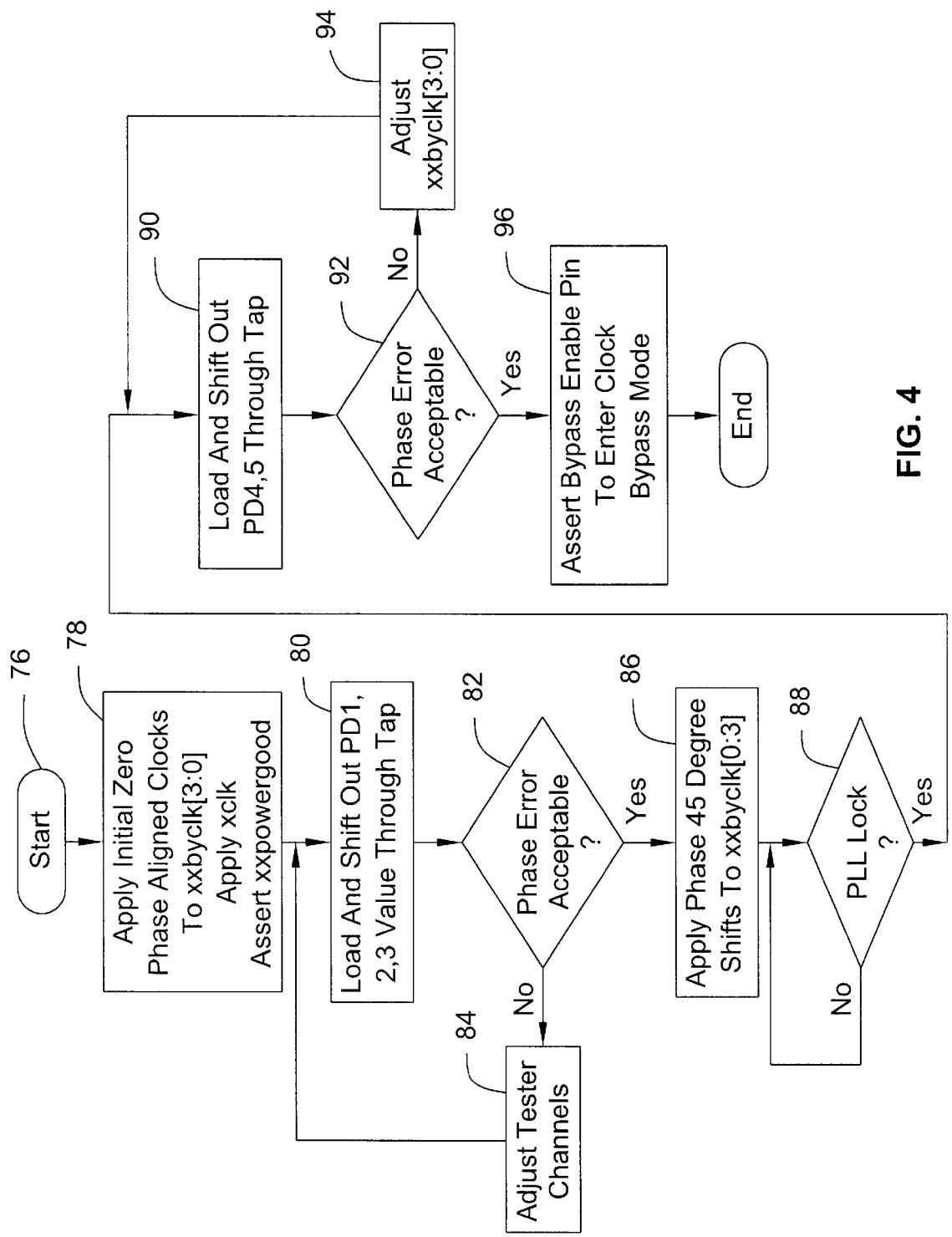
FIG. 4 is a flow chart for software for implementing a core PLL bypass mode in accordance with one embodiment of the present invention.

Referring to FIG. 4, the software 76 for aligning the core clock signal 26 in the bypass mode begins by applying the initial phase aligned (i.e. non-phase shifted) clocks signal 12 and asserting power good. The phase detectors 30, 32, and 34 are loaded and scanned out through the TAP 28. The tester-generated clock signal 12*a* is chosen as a reference and the other signals 12 are then aligned to that reference. A check at diamond 82 determines whether the phase error is acceptable. If not, the tester 13 adjusts the phase aligned signals 12, as indicated in block 84.

If the phase error is acceptable, the forty-five degree phase shifts are applied to the signals 12 to create the waveforms shown in FIGS. 3*a* through 3*d*. If the core PLL 36 locks, then the flow moves on to the phase detectors 60 and 62. The phase detectors 60 and 62 may be loaded and then shifted out through the TAP 28, as indicated in block 90. Again, if the phase error detected by the detectors 60 and 62 is acceptable, as determined in diamond 92, the bypass enable pin (not shown) on the processor 10 may be asserted to enter the core PLL clock bypass mode, as indicated in block 96. Otherwise, the signals 12 are adjusted by the tester 13, as indicated in block 94.

Figure 5:
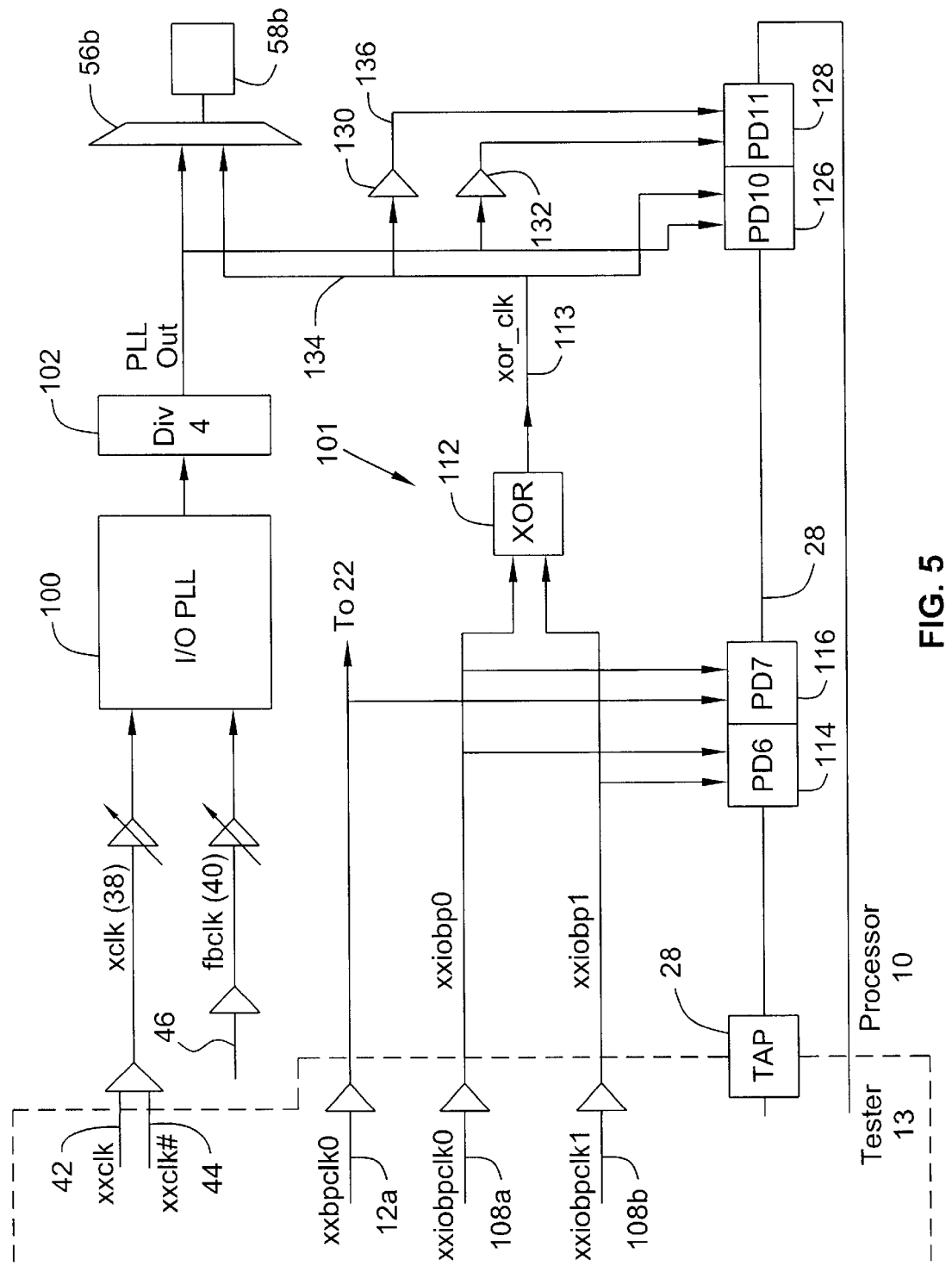
FIG. 5 is a schematic depiction of a tester and a portion of a processor including the I/O PLL in accordance with one embodiment of the present invention.

A similar arrangement is provided for the I/O PLL 100 as shown in FIG. 5. However, the I/O bypass clock signal is generated by an exclusive OR of two tester-generated clock signals 108. The signals 108 are phase shifted ninety degrees as illustrated in FIGS. 6*c* and 6*d*.

Figure 6:
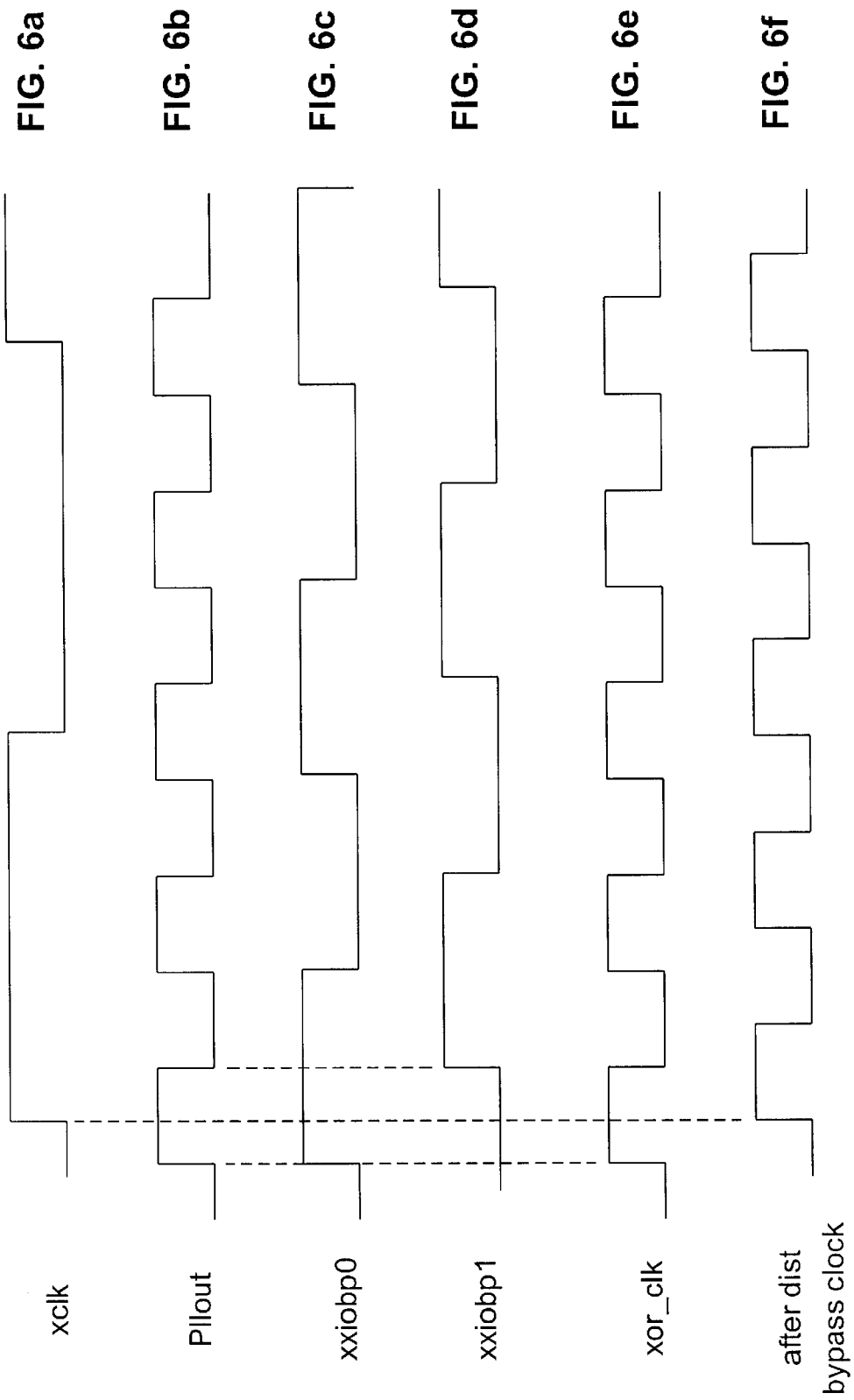
FIGS. 6a through 6f show hypothetical waveforms for signals indicated in FIG. 5, in accordance with one embodiment of the present invention.

The exclusive OR gate 112 output signal 113, shown in FIG. 6*e*, may then be applied to the multiplexer 56. Again, the exclusive ORed signal 113 is at a higher frequency than the tester-generated signals 108. The I/O PLL 100 receives the reference clock signal 38. (shown in FIG. 6*a*). The I/O PLL 100 output signal is then divided, as indicated at 102, and provided to the multiplexer 56*b*. The divided PLL output clock signal to the multiplexer 56*b* is shown in FIG. 6*b*.

Both PLLs 100 and 36 normally transition to the bypass mode at the same time. Of course, because the I/O PLL 100 normally operates at much lower frequency in some embodiments, fewer tester-generated signals 108 may be needed to produce the relatively higher frequency clock signal 113, shown in FIG. 6*e*. FIG. 6*f* shows the waveform of FIG. 6*e* after distribution.

The phase detectors 114 and 116 operate like the phase detectors 30, 32 and 34, already described. The phase detector 114 aligns the signals 108*a* and 108*b*. The phase detector 116 aligns the signals 108 with the core tester-generated clock signal 12*a*. Once alignment with a core clock signal 12*a* is achieved, because the other core tester-generated clock signals 12*b*–*d* are similarly aligned to the signal 12*a*, alignment is achieved. The phase detectors 126 and 128 provide fine tuning in the same fashion achieved with the phase detectors 60 and 62.

Figure 7:
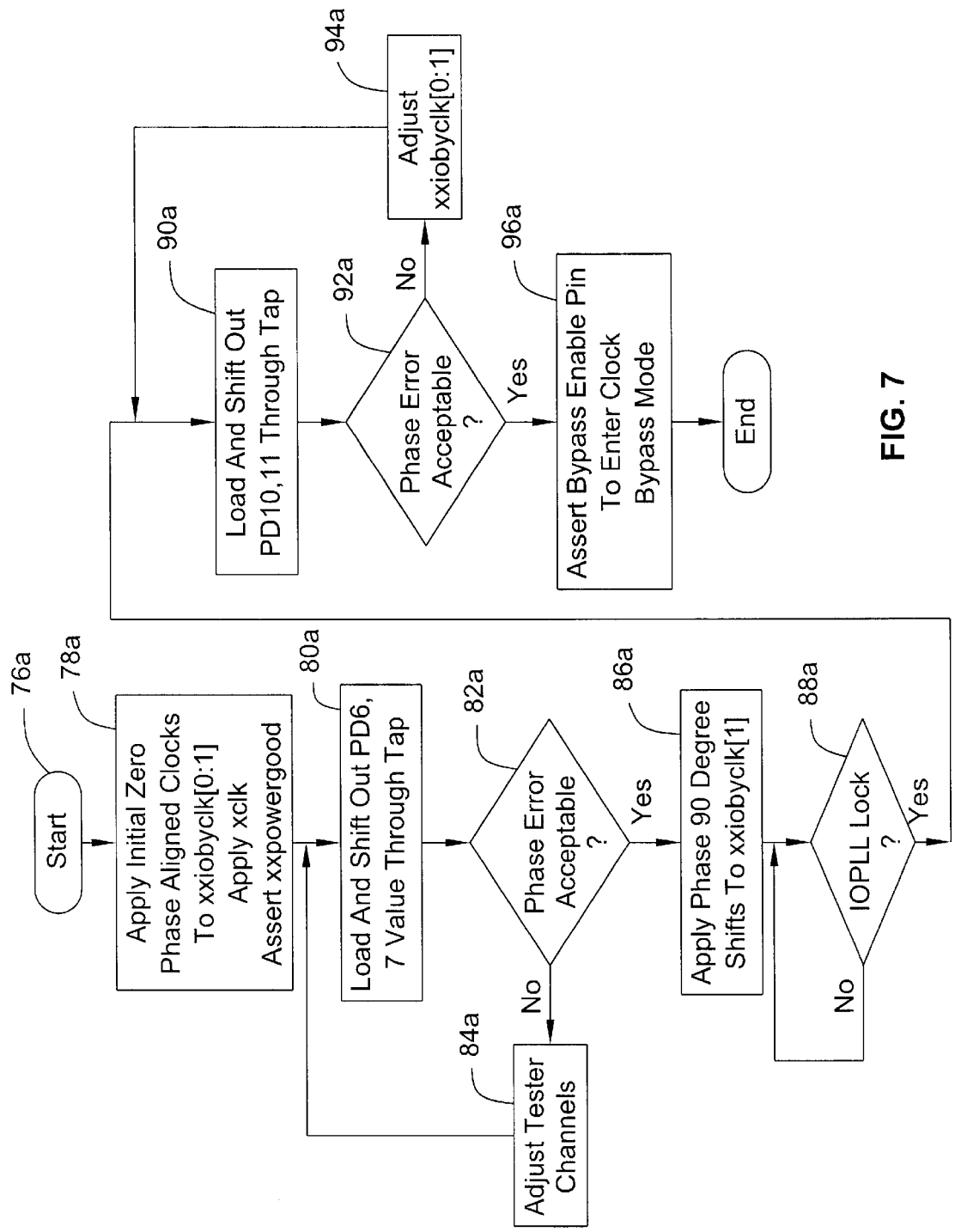
FIG. 7 is a flow chart for software for implementing an I/O PLL bypass mode in accordance with one embodiment of the present invention.

The software 76*a*, shown in FIG. 7, for aligning the I/O PLL 100, in accordance with one embodiment, operates similarly to the software 76, shown in FIG. 4. Initially, the tester 13 generates the phase aligned clock signals 108 and asserts power good, as indicated in block 78*a*. The phase detectors 114 and 116 are loaded and shifted out through the TAP 28 as indicated in block 80*a*. A check at diamond 82*a* determines whether the phase error is acceptable. If not, the tester signals are adjusted as indicated in block 84*a*.

If the phase error is acceptable, the ninety degree phase shift is applied to the signal 108*b* as indicated in block 86*a*. A check at diamond 88*a* determines whether the I/O PLL 100 locks. Once it does, the values in the phase detectors 126 and 128 are loaded and shifted out through the TAP 28, as indicated in block 90*a*. If the phase error is acceptable, as determined in diamond 92*a*, the bypass enable pin may be enabled, entering the I/O PLL clock bypass mode as indicated in block 96*a*. Otherwise, the signals 108 are adjusted as indicated in block 94*a*.

Thus, the processor 10 generates two clocks whose outputs are aligned. These outputs are aligned because of the common reference signal and the feedback signals seen at the end of the clock distribution trees 58. Namely, upon PLL lock, the state elements at the end of the clock distribution trees that use the clock, see the same clock signal synchronized to the reference clock used for all the other components of the processor 10. Each PLL on the processor 10 generates a clock signal and accounts for skews so that all the state elements in the clock distribution trees see the same clock signal at the same time synchronously.

Figure 8:
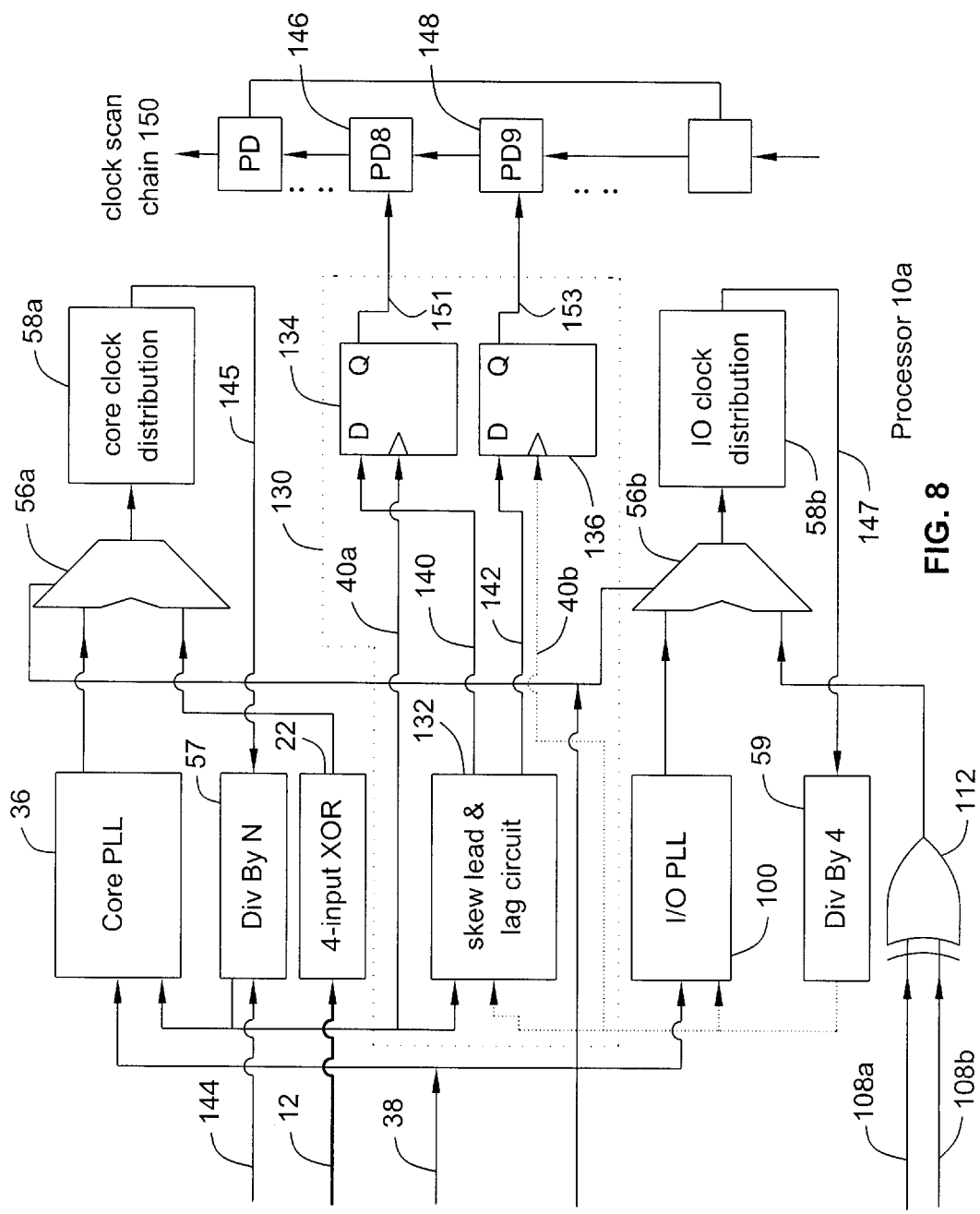
FIG. 8 is a block diagram of another embodiment of the present invention.

In some cases, it is desirable to provide a bypass mode that does not rely on the core or I/O PLLs 36 and 100. The processor 10*a*, shown in FIG. 8, enables a bypass mode without reliance on the core PLL 36 or the I/O PLL 100. The skew lead and lag circuit 132 measures the clock distribution difference between the I/O clock signal 147 and the core clock signal 145. The circuit 132 uses this difference to align both clock domains through the tester 13.

In the bypass mode implemented by the processor 10*a*, there are no PLL loops that lock their clocks to the same reference. The external bypass clocks 12 and 108 from both the core and the I/O systems maintain the same relationship as in the normal or non-bypass mode to avoid erroneous results. The circuit 132 inputs are the divided I/O domain signal 40*b* and the divided core domain signal 40*a* at the end of their distribution trees 58*b* and 58*a* respectively.

To measure the distribution difference between the core and I/O domains, one of the bypass clocks 12 or 108, with the same frequency and phase, from each domain (core or I/O) is applied by the tester 13. After each clock 12 or 108 propagates through its clock distribution tree 58, the resulting signals 145 or 147 contain the distribution delay of each distribution 58*a* or 58*b*. These signals 145 and 147 are divided at a divider 57 or 59.

Figure 9:
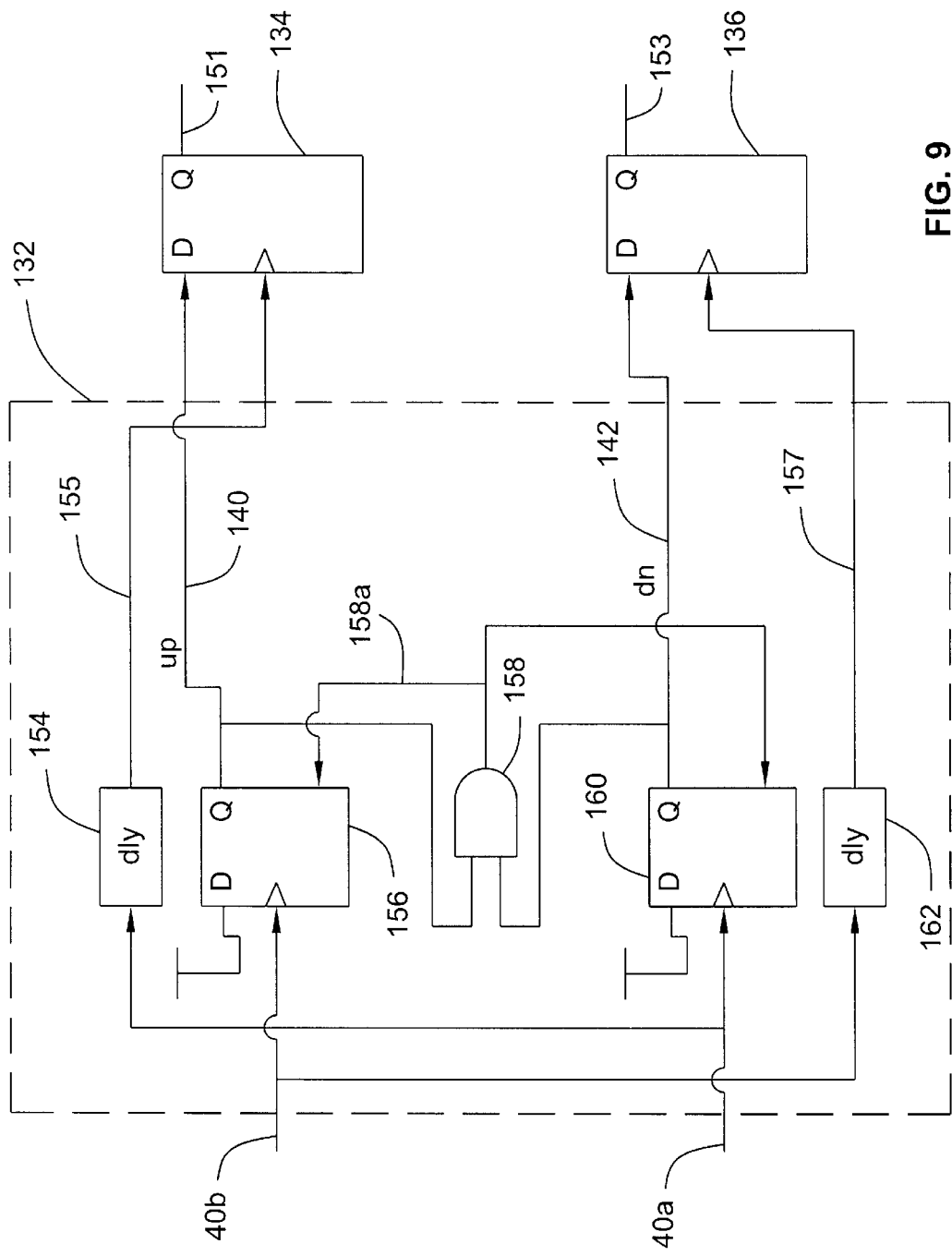
FIG. 9 is a block diagram of the skew lead and lag circuit shown in FIG. 8.

The rising edge of the leading signal 40*a* sets a flip-flop 160, shown in FIG. 9, that remains set until the lagging clock is received. The lagging clock 40*b* sets the flip-flop 156. When both signals 140 and 142 from a skew lead and lag circuit 132 are high for an interval, a reset is generated to deassert both flip-flops 160 and 156.

The widths of the signals 140, 142 indicate the difference in the distributions 58*a* and 58*b*. Then, each of these signals 140 and 142 are flopped with a signal 40*a* or 40*b* from the opposite domain. For example, a signal 140 developed from the I/O domain is flopped with the signal 40*a* from the core domain. The outputs 151 and 153 are scanned into the clock scan chain 150, and read by the tester 13. The outputs 151 and 153 from the flops 134 and 136 become the I/O lead and I/O lag signals to the phase detectors 146 and 148.

Based on the scan output, the tester 13 adjusts the phase of one of these clock signals 12 or 108 until both outputs 151 and 153 are high (when zero difference is detected) or when the lead/lag signal flip polarity indicates that alignment is achieved (based on tester resolution). That is, every time a first domain leads a second domain, an incremental adjustment may be made. This may continue until the point where the second domain leads the first domain. At that point, the skew has been substantially compensated.

The core clock signal 145 and the I/O clock signal 147 may be divided at 57 and 59 respectively and fed to the skew lead and lag circuit 132. The circuit 132, shown in FIG. 9, receives the core clock signal 40*a*, which may have been divided and the I/O clock signal 40*b* which also may have been divided.

The I/O domain signal 40b is coupled to the clock input of a D flip-flop 156. The D input to the flip-flop 156 is coupled to the power supply. Thus, when the rising edge of the signal 40b arrives at the flip-flop 156, a high signal is generated from the Q output of the flip-flop 156, forming the signal 140.

At the same time the core domain signal 40a is applied to a delay unit 154 as shown in FIG. 9. The delay units 154 and 162 (omitted in FIG. 8 for clarity) produce a delay to compensate for the latency of the skew lead and lag circuit 132. The output of the delay unit 154 is a signal 155 which is applied to the clock input of the D flip-flop 134. The D input to the flip-flop 134 is the signal 140 from the flip-flop 156. The output 151 is generated when the signal 155 arrives at the clock input of the flip-flop 134. The flip-flops 134 and 136 work in the same way as do the flip-flops 156 and 160.

A delayed reset signal 158a may be applied to each flip-flop 156 and 160 from the AND gate 158 when both signals 140 and 142 are high. Both signals 140 and 142 are transitioned to a low signal after a delay that follows the instance when both signals 140 and 142 are high.

Figures 10A, 10B, 10C, 10D, 10E:
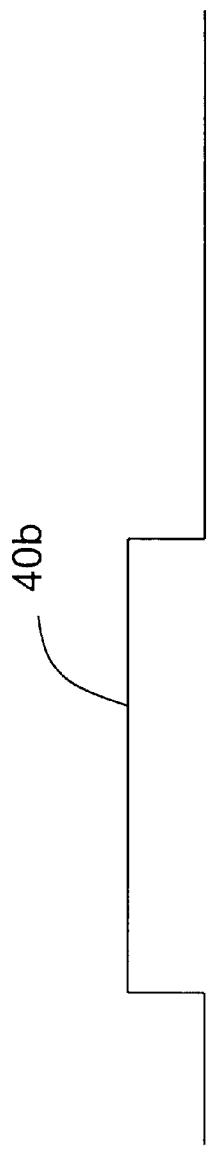
FIGS. 10a through 10e show a plurality of hypothetical waveforms in the skew lead and lag circuit of FIG. 8 in accordance with one embodiment of the present invention.

Thus, the delayed I/O domain signal 40b is offset from the delayed core domain signal 40a as shown in FIGS. 10a and 10b. In FIG. 10c, the rising edge of the delayed I/O domain signal 40b triggers the up output signal 140. Similarly, the rising edge of the delayed core domain signal 40a triggers the down signal 142 shown in FIG. 10d. The output signal 151, shown in FIG. 10e, from the flip-flop 134, is triggered on the rising edge of the signal 155.

Referring to FIG. 11, the core domain signal before distribution is shown in FIG. 11a, the core domain signal 145 after distribution is shown in FIG. 11b, and the core domain signal 40a (after delay and divide by N 57) is shown in FIG. 11c. Similarly, the I/O domain signal before distribution is shown in FIG. 11d, the I/O domain signal 147 after distribution is shown in FIG. 11e, and the I/O domain signal 40b (after delay and divide by four 59) is shown in FIG. 11f.

The delay 299 shown in FIG. 11c is the delay due to the core distribution and the delay 301 is the delay due to I/O distribution. The I/O and core domain's distribution difference, in this example, is indicated at 300. The I/O lead signal 140 shown in FIG. 11g is formed by flopping a high signal with the I/O feedback signal 40b. The output signal 151 (FIG. 11h) is formed by flopping the I/O lead signal 140, shown in FIG. 11g, with the core feedback signal 40a shown in FIG. 11c. In this example, the I/O clock is leading the core clock. Thus, the signal 151 may be utilized to incrementally adjust either or both of the tester-generated clocks 108 and 12 to reduce the difference in distribution effect.

In FIG. 12, the opposite situation is occurring; that is, the I/O domain signal 40b is lagging the core domain signal 40a (compare delays 302 and 304). In this example, the I/O lag signal 142 shown in FIG. 12g is flopped with the I/O feedback signal 40b shown in FIG. 12e to produce the output signal 153 which is provided to the scan out chain 150.

Figure 13:
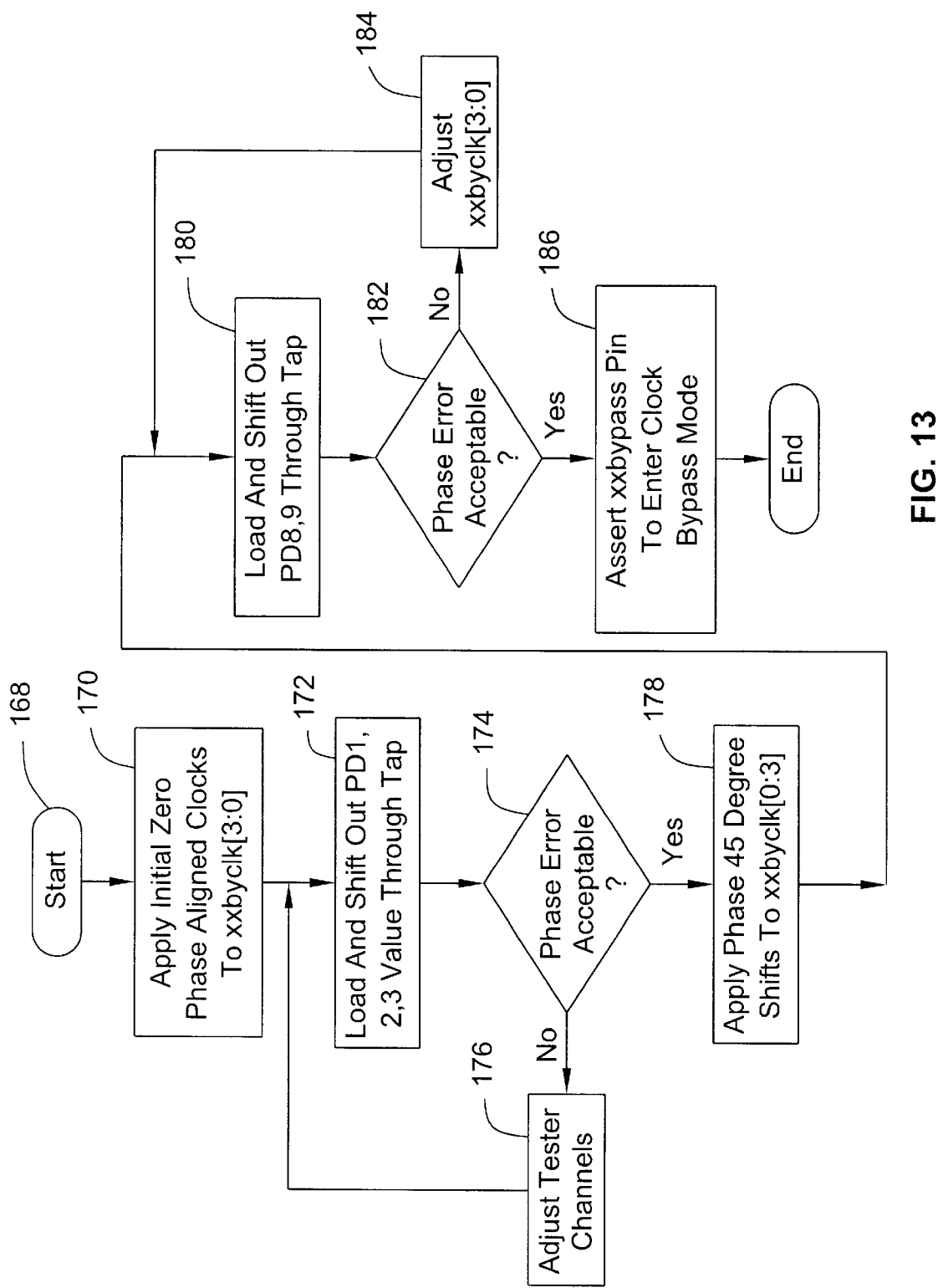
FIG. 13 is a flow chart for software for implementing a bypass mode for the circuit shown in FIG. 8 for the core bypass.

Referring to FIG. 13, the software 168 for aligning the core domain signal 40a in the bypass mode begins by applying the initial phase aligned (i.e. non-phase shifted) clock signals 12. The phase detectors 30, 32 and 34 are loaded and scanned out through the tap 28. A check at diamond 174 determines whether the phase error is acceptable. If not the tester 13 adjusts the tester channels as indicated in block 176. If the phase error is acceptable, the forty-five degree phase shifts are applied to the signals 12 to create the phase shifted signals 12 shown in FIGS. 3a–3d.

Next, the signals from the phase detectors 146 and 148 are loaded and shifted out through the tap 28 as indicated in block 180. A check at diamond 182 determines whether the phase error is acceptable. If not, the clocks 12 are adjusted as indicated in block 184. If the phase error is acceptable, as determined at diamond 182, the bypass enable pin is inserted to enter the bypass mode as indicated in block 186.

Figure 14:
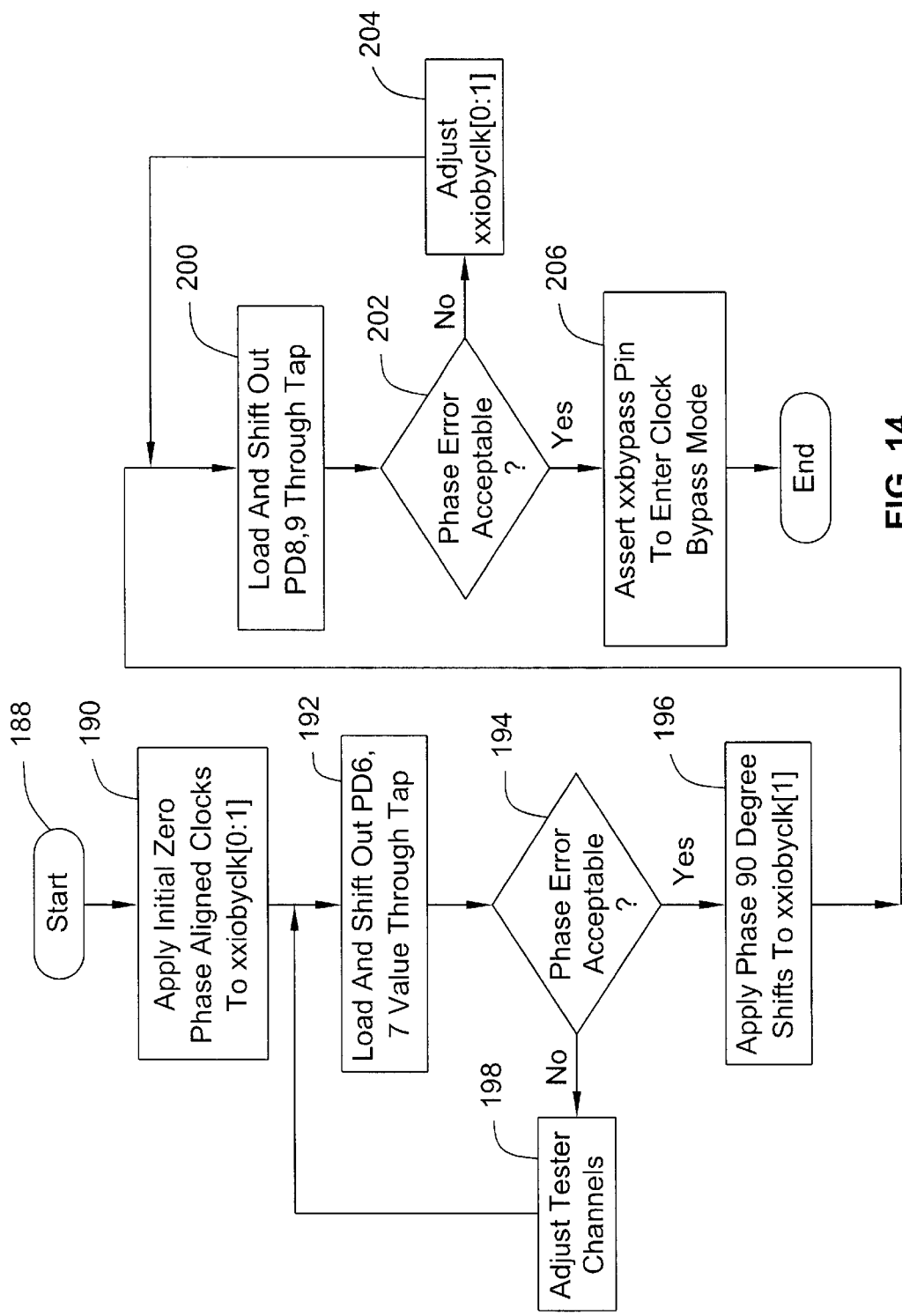
FIG. 14 is a flow chart for software for implementing a bypass mode for the circuit shown in FIG. 8 for the I/O clock.

Turning next to FIG. 14, the software 188 for aligning the I/O system in accordance with one embodiment, operates similarly to the software 168, shown in FIG. 13. Initially, the tester 13 generates the phase aligned clock signals 108 as indicated in block 190. The phase detectors 114 and 116 are loaded and shifted out through the tap 28 as indicated in block 192. A check at diamond 194 determines whether the phase error is acceptable. If not, the tester adjusts the tester channels as indicated in block 198.

If the phase error is acceptable, the ninety degree phase shift is applied to the clock signal 108b as indicated in block 196. Next, the values are loaded and shifted out through the phase detectors 146 and 148 as indicated in block 200.

If the phase error is not acceptable as determined in diamond 202, the clock signals 108 are adjusted as indicated in block 204. Otherwise, if the phase error is acceptable as determined in diamond 202, the bypass enable pin is asserted to enter the clock bypass mode as indicated in block 206.

The flip-flops 134 and 136 may be metastable flip-flops. The tester 13 makes its adjustments by adjusting the signals 12 and 108. With the very small window that exists while the tester adjusts one phase, it is possible that the output of one of the flip-flops will be sampled at the same time the opposite clock is rising. This limits the maximum resolution of the circuit to about 100 picoseconds. That is more than enough time to proceed with the test, in particular with the outbound de-skew flops that tolerate much higher skew between the two domains.

In normal mode, a divider generates other clocks in addition to the clock that goes to each PLL. The divider sends feedback to the PLL and the PLL locks with respect to that feedback. In the bypass mode that does not apply on the PLLs, feedback is an open loop, and the divider 57 (FIG. 8) needs to be aligned to something such that the clocks are all aligned. Thus, when the PLLs are not used, the PLLs fail to function to align the divider 57 which also generates other clocks such as address, strobe and bus signals. Thus, the divider 57 is synchronized by generating a single shot reset in a bypass mode propagated in a deterministic way to the divider 57 as indicated by the signal 144 in FIG. 8. The adjustment is deterministic since the single shot reset is achieved in a known cycle so that the output of the divider 57 generates a clock aligned also to a known cycle.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
   a core phase locked loop circuit;
   a core phase locked loop bypass circuit coupled to receive a plurality of external clock signals;
   a core multiplexer coupled to said core phase locked loop and said core phase locked loop bypass circuit to selectively pass one of said clock signals;
   an input/output phase locked loop;
   an input/output phase locked loop bypass circuit coupled to receive a plurality of external clock signals; and an input/output multiplexer coupled to said input/output phase locked loop and said input/output phase locked loop bypass circuit to selectively pass one of the signals.

2. The processor of claim 1 wherein said core phase locked loop bypass circuit and said input/output phase locked loop bypass circuit generate clock signals during a phase locked loop bypass mode without using said phase locked loops.

3. The processor of claim 1 wherein said core phase locked loop bypass circuit and said input/output phase locked loop bypass circuit are used in conjunction with said core phase locked loop and said input/output phase locked loop to develop clock signals in a phase locked loop bypass mode.

4. The processor of claim 1 wherein each of said bypass circuits includes a circuit to receive a plurality of phase shifted clock signals and produce an output signal having a higher frequency than said input signals.

* * * * *